(12) United States Patent
Tsunoda et al.

(10) Patent No.: US 10,017,133 B2
(45) Date of Patent: Jul. 10, 2018

(54) VEHICULAR PANEL AND WIRING STRUCTURE FOR VEHICLE

(71) Applicant: YAZAKI CORPORATION, Tokyo (JP)

(72) Inventors: Mitsunori Tsunoda, Shizuoka (JP); Gaku Ito, Shizuoka (JP); Tomoaki Sasaki, Shizuoka (JP); Shuji Kimura, Shizuoka (JP); Taku Furuta, Shizuoka (JP); Shoichi Nomura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/355,149

(22) Filed: Nov. 18, 2016

(65) Prior Publication Data

US 2017/0151916 A1 Jun. 1, 2017

(30) Foreign Application Priority Data

Nov. 27, 2015 (JP) .................. 2015-231572

(51) Int. Cl.
*B60R 16/02* (2006.01)
*H05K 3/26* (2006.01)
(Continued)

(52) U.S. Cl.
CPC .......... *B60R 16/02* (2013.01); *B60R 16/0215* (2013.01); *H05K 1/0265* (2013.01); *H05K 1/0284* (2013.01); *H05K 1/181* (2013.01); *H05K 3/26* (2013.01); *H05K 3/043* (2013.01); *H05K 3/045* (2013.01); *H05K 3/125* (2013.01); *H05K 3/247* (2013.01); *H05K 2201/0338* (2013.01); *H05K 2201/0352* (2013.01); *H05K 2201/0391* (2013.01); *H05K 2201/09036* (2013.01); *H05K 2201/09727* (2013.01);
(Continued)

(58) Field of Classification Search
CPC . B60R 16/02; H05K 3/26; H05K 3/12; H05K 1/18; H05K 1/02
USPC ........................................ 361/760
See application file for complete search history.

(56) References Cited

U.S. PATENT DOCUMENTS 4,707,394 A * 11/1987 Chant .................... H05K 3/107
156/150
4,869,670 A * 9/1989 Ueda ................... B60R 16/0207
174/72 A
(Continued)

FOREIGN PATENT DOCUMENTS

JP S56-154316 A 11/1981
JP H01-067809 A 3/1989
(Continued)

OTHER PUBLICATIONS

Official action dated Dec. 5, 2017 in the counterpart Japanese patent application.
(Continued)

*Primary Examiner* — Michael F McAllister
(74) *Attorney, Agent, or Firm* — Metrolexis Law Group, PLLC (57) ABSTRACT

An instrument panel as a vehicular panel includes a panel body on a surface side of which key tops are installed, a printed wiring section arranged on the surface side of the panel body, and an insulation outer layer arranged on the surface side of the panel body so as to cover the printed wiring section.

2 Claims, 8 Drawing Sheets

(51) Int. Cl.
*H05K 1/02* (2006.01)
*H05K 1/18* (2006.01)
*H05K 3/12* (2006.01)
*H05K 3/04* (2006.01)
*H05K 3/24* (2006.01)

(52) U.S. Cl.
CPC .............. *H05K 2201/09736* (2013.01); *H05K 2201/10053* (2013.01); *H05K 2201/10272* (2013.01); *H05K 2203/025* (2013.01); *H05K 2203/0353* (2013.01); *H05K 2203/0545* (2013.01)

(56) References Cited

U.S. PATENT DOCUMENTS

| | | | | |
|---|---|---|---|---|
| 5,805,402 A | * | 9/1998 | Maue | B60R 16/0207 307/10.1 |
| 5,846,854 A | * | 12/1998 | Giraud | G02F 1/13439 438/149 |
| 5,936,818 A | * | 8/1999 | Maue | B60R 16/0207 361/115 |
| 6,000,959 A | * | 12/1999 | Curtindale | B60R 16/0207 439/246 |
| 6,106,303 A | * | 8/2000 | Wojewnik | B60R 13/0243 439/34 |
| 6,640,434 B1 | * | 11/2003 | Wojewnik | B60R 16/0207 29/825 |
| 7,152,907 B2 | * | 12/2006 | Salhoff | B60J 5/00 296/146.7 |
| 9,241,415 B2 | * | 1/2016 | Quinn | B60R 16/0207 |
| 2002/0041110 A1 | * | 4/2002 | Odashima | B60J 5/0416 296/146.7 |
| 2008/0265613 A1 | * | 10/2008 | Hockenberry | B60J 5/0418 296/146.1 |

FOREIGN PATENT DOCUMENTS

| | | |
|---|---|---|
| JP | H02-158191 A | 6/1990 |
| JP | H07-221411 A | 8/1995 |
| JP | 2002-019544 A | 1/2002 |
| JP | 2003-204140 A | 7/2003 |

OTHER PUBLICATIONS

Japanese office action dated Apr. 3, 2018 in a counterpart Japanese Patent application.

* cited by examiner

VEHICULAR PANEL AND WIRING STRUCTURE FOR VEHICLE

CROSS REFERENCE TO RELATED APPLICATION

The present application is based on, and claims priority from Japanese Patent Application No. 2015-231572, filed Nov. 27, 2015, the disclosure of which is hereby incorporated by reference herein in its entirety.

TECHNICAL FIELD

The present application relates to a vehicular panel and a wiring structure for a vehicle.

BACKGROUND ART

Figure 12:
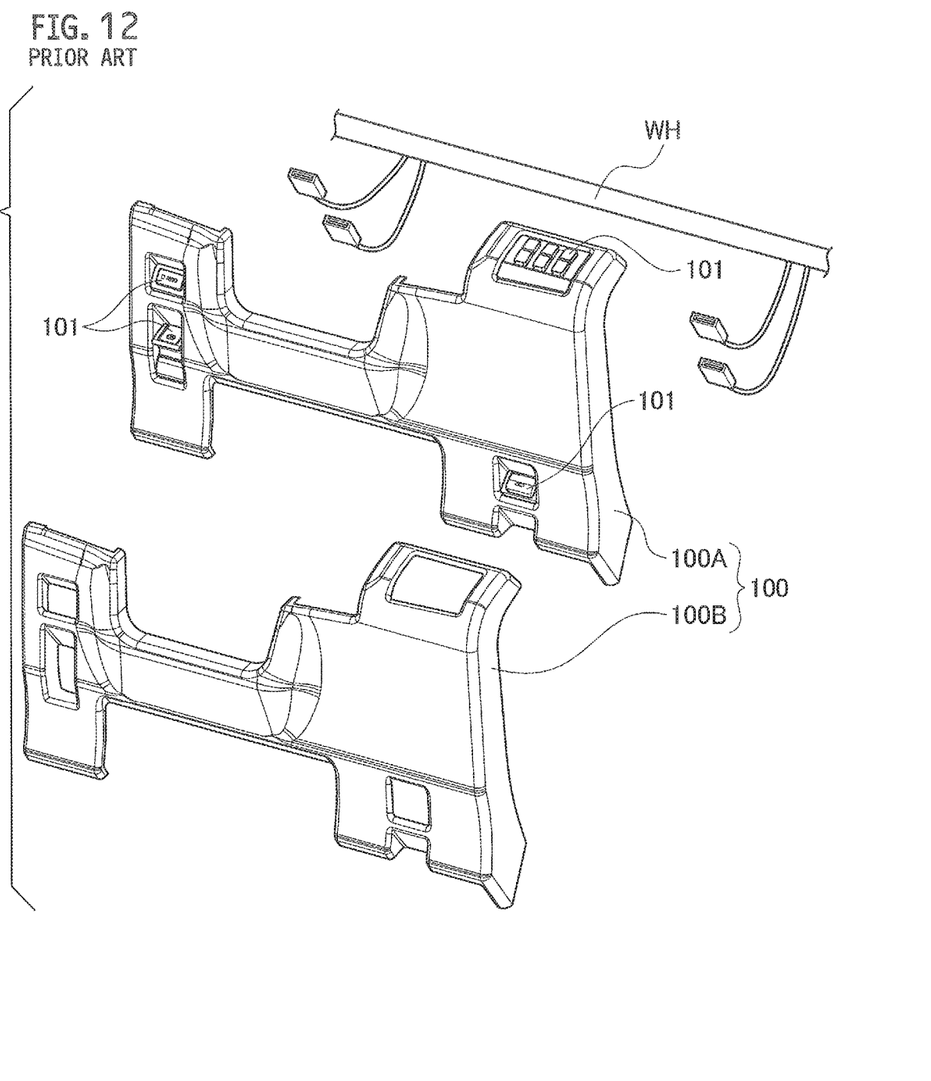
FIG. 12 is a perspective view of an instrument panel and a wire harness according to a conventional example.

Heretofore, various proposals have been made for an electric wire arrangement of a vehicular panel that uses a wire harness (see JP H01-067809 A). A vehicular panel having such a structure according to a conventional example is illustrated in FIG. 12. In FIG. 12, a plurality of electric components 101 are installed on the surface side of an instrument panel 100 as the vehicular panel according to the conventional example. The instrument panel 100 is composed of a panel body 100A and an outer layer 100B arranged on the surface side thereof. A wire harness WH is wired on the back side of the instrument panel 100. Electric connections between the electric components 101 are made by the wire harness WH.

SUMMARY

In the vehicular panel according to the conventional example, a wiring operation of the wire harness WH, and a connecting operation of connectors between the wire harness WH and the panel body 100A, and the like need to be performed on the back side of the panel body 100A. On the other hand, operations such as mounting of the electric components 101, and mounting of the outer layer 100B to the panel body 100A, and the like need to be performed on the surface side of the panel body 100A. Since it is necessary that operations are performed on both the surface side and the back side of the panel body 100A as such, there is a problem that workability in the manufacturing process is poor.

Accordingly, the present application was made to solve the above-described problem and it aims to provide a vehicular panel and a wiring structure for vehicle which have good workability in the manufacturing process.

A vehicular panel according to a first aspect of the present application includes a panel body on a surface side of which an electric component is installed, a printed wiring section including a conductive member arranged on the surface side of the panel body, and an insulation outer layer arranged on the surface side of the panel body so as to cover the printed wiring section.

A wiring structure for vehicle according to a second aspect of the present application includes a panel body on a surface side of which an electric component is installed, an insulation outer layer arranged on the surface side of the panel body, and a printed wiring section including a conductive member arranged between the panel body and the insulation outer layer.

With the vehicular panel according to the first aspect of the present application and the wiring structure for vehicle according to the second aspect of the present application, a mounting operation of the electric component, an arranging operation of the printed wiring section, and a mounting operation of the insulation outer layer to the panel body can be performed from the surface side of the panel body, and therefore, workability in the manufacturing process is good.

DESCRIPTION OF EMBODIMENTS

Hereinafter, a vehicular panel according to an embodiment will be explained based on the drawings.
(Overall Structure)

An instrument panel 1 as the vehicular panel according to the embodiment and a wiring structure for vehicle applied thereto will be explained.

Figure 1:
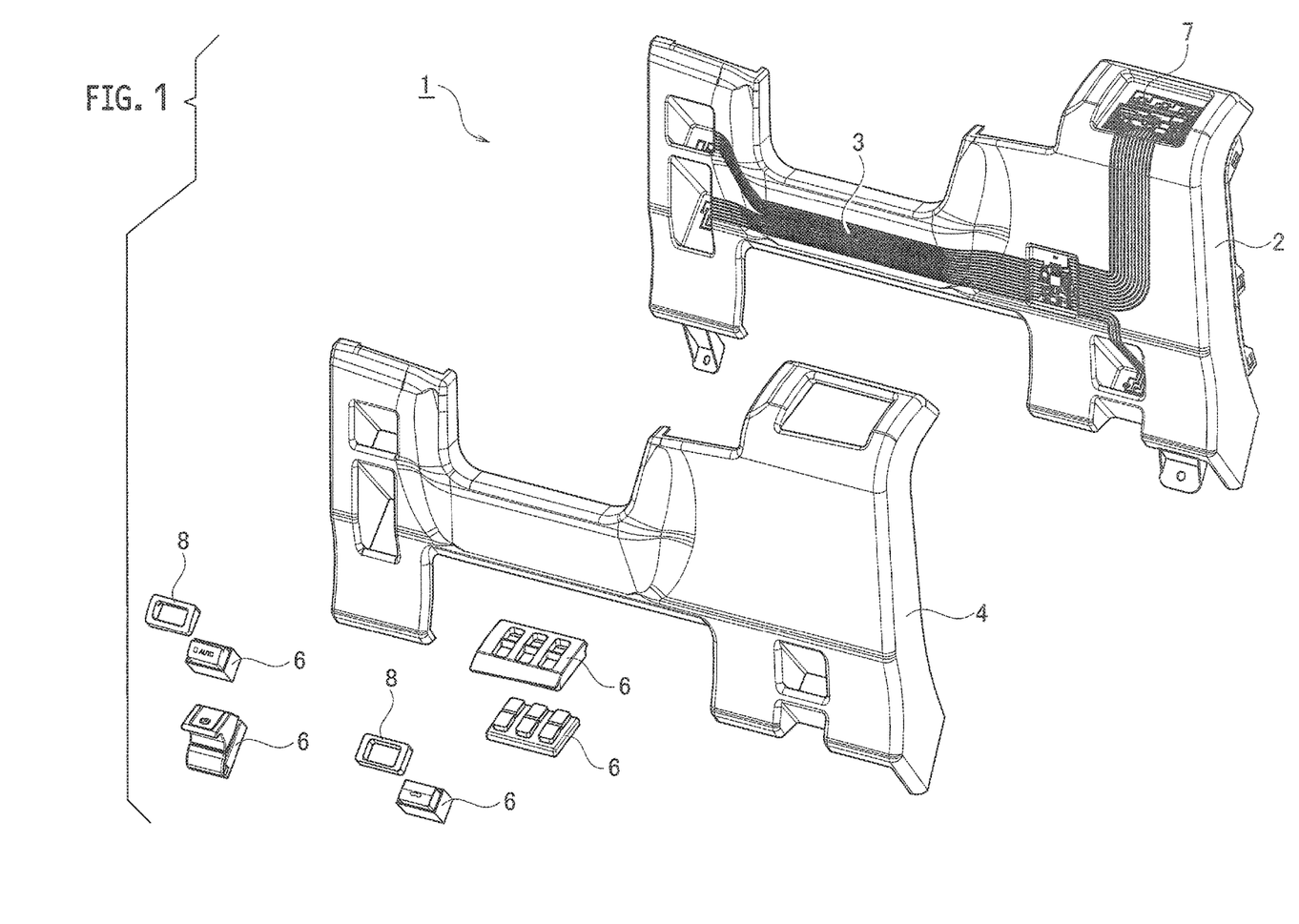
FIG. 1 is an exploded perspective view of an instrument panel according to an embodiment.

As illustrated in FIG. 1, the instrument panel 1 as the vehicular panel according to the embodiment includes a panel body 2, a printed wiring section 3 arranged on the surface of the panel body 2, and an insulation outer layer 4 arranged on the surface side of the panel body 2 so as to cover the printed wiring section 3.

Key tops 6 of switches as a plurality of electric components are installed on the surface side of the panel body 2.

The printed wiring section 3 is arranged by directly printing a conductive member (conductive ink, conductive paste, or the like) on the surface of the panel body 2. An electronic component 7 for the switches is mounted on a terminal of the printed wiring section 3. Fabrication of the printed wiring section 3 and mounting of the electronic component 7 will be described in detail below.

The insulation outer layer 4 is formed in approximately the same shape as a surface shape of the panel body 2. The insulation outer layer 4 covers almost entirety of the panel body 2 except for the installation regions of the key tops 6.

Assembling order of the instrument panel 1 will be explained. An intended printed wiring section 3 is formed such as by spraying conductive ink with an ink jet nozzle (not illustrated) onto the surface of the panel body 2. Next, the key tops 6 of the switches are mounted on the panel body 2 from its surface side. Then, the insulation outer layer 4 is affixed to the surface side of the panel body 2. Next, bezels 8 are put on the surface side of the panel body 2 so as to cover the parting lines. With this, assembly of the instrument panel 1 is completed.

As explained above, the instrument panel 1 includes the panel body 2 on the surface side of which the key tops 6 as the electric components are installed, the printed wiring section 3 arranged on the surface of the panel body 2, and the insulation outer layer 4 arranged on the surface side of the panel body 2 so as to cover the printed wiring section 3. As the vehicular wiring structure, it has a structure such that it includes the panel body 2 on the surface side of which the key tops 6 as the electric components are installed, the insulation outer layer 4 arranged on the surface side of the panel body 2, and the printed wiring section 3 arranged between the panel body 2 and the insulation outer layer 4.

Therefore, mounting of the key tops 6 as the electric components, an arranging operation of the printed wiring section 3, and a mounting operation of the insulation outer layer 4 onto the panel body 4 can all be performed from the surface side of the panel body 2, and thus, workability in the manufacturing process is good.

Since the insulation outer layer 4 has a design function of the instrument panel 1 and at the same time performs insulation and protection of the printed wiring section 3, it is not necessary to provide an insulation protective film on the surface of the printed wiring section 3 separately.

In the embodiment, the printed wiring section 3 is arranged by directly printing the conductive member (such as conductive ink) on the surface of the panel body 2, but it can also be arranged for example by affixing a film on which a conductive member (such as conductive ink) is printed onto the surface of the panel body 2.
(Details of the Printed Wiring Section)

Figure 2A:
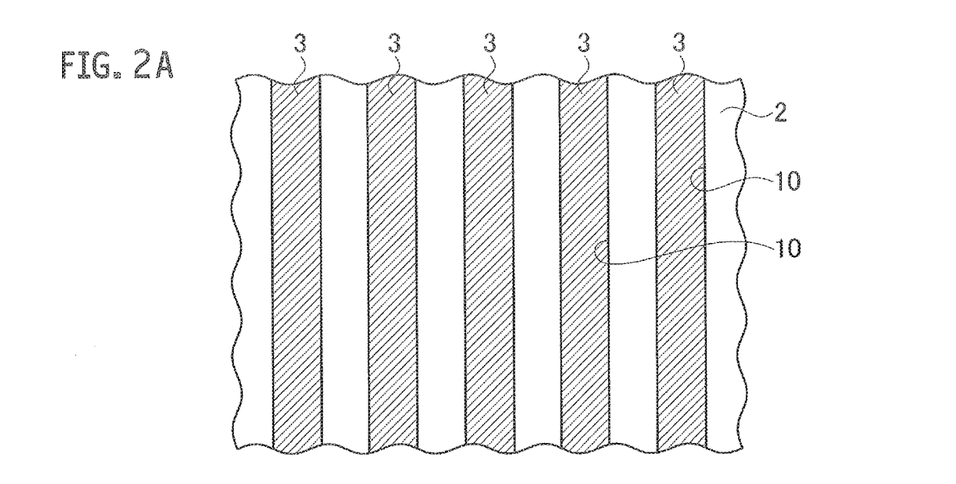
FIG. 2A is a plan view of a main part of printed wiring sections of the instrument panel according to the embodiment (in which printed wiring sections 3 are illustrated as being hatched).
Figure 2B:
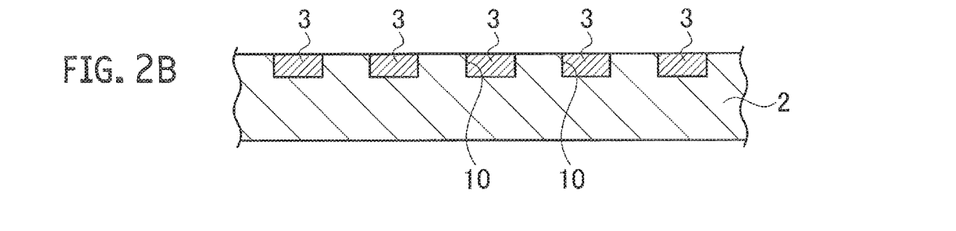
FIG. 2B is a cross-sectional view of the main part of the printed wiring sections of the instrument panel according to the embodiment.
Figure 3A:
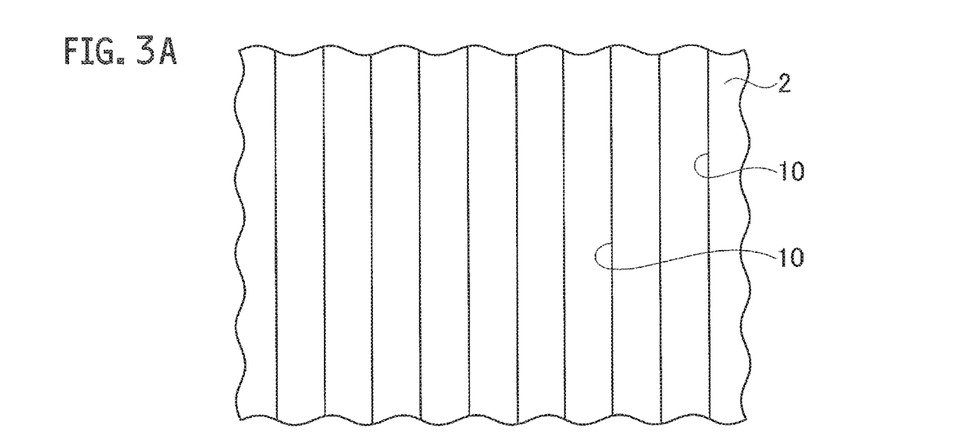
FIG. 3A is a plan view of the main part for explanation of a manufacturing process of the printed wiring sections of the instrument panel according to the embodiment.
Figure 3B:
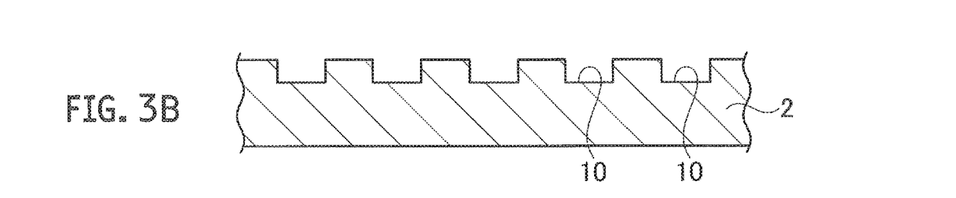
FIG. 3B is a cross-sectional view of the main part for explanation of a manufacturing process of the printed wiring sections of the instrument panel according to the embodiment.
Figure 4A:
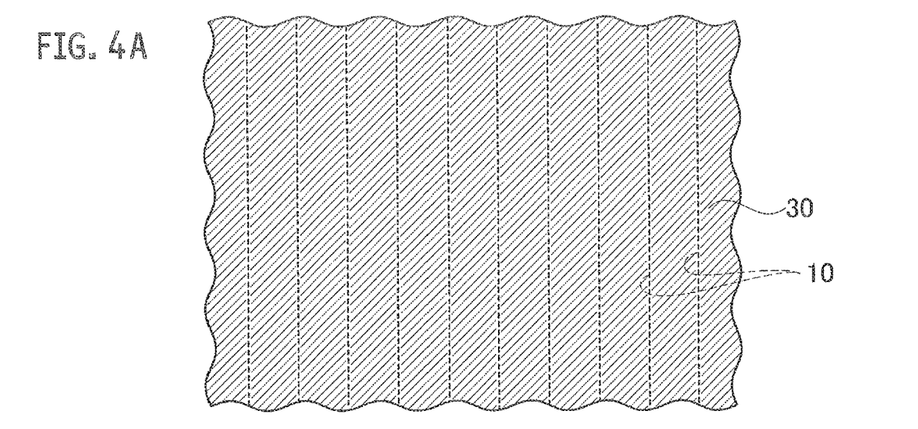
FIG. 4A is a plan view of the main part for explanation of a manufacturing process of the printed wiring sections of the instrument panel according to the embodiment (in Which a conductive member 30 is illustrated as being hatched).
Figure 4B:
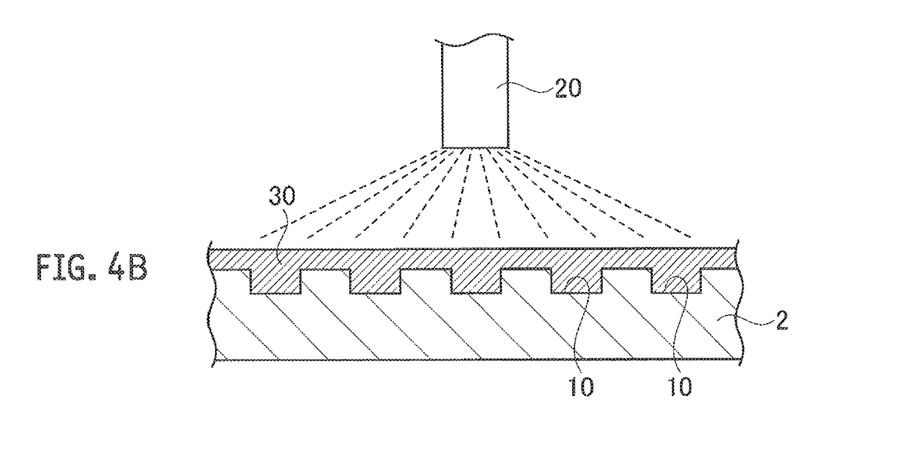
FIG. 4B is a cross-sectional view of the main part for explanation of a manufacturing process of the printed wiring sections of the instrument panel according to the embodiment.
Figure 5:
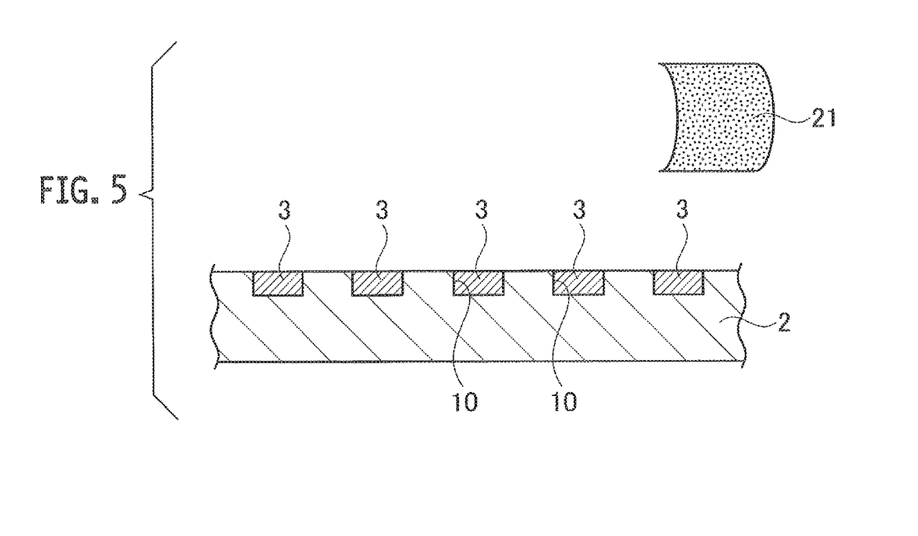
FIG. 5 is a cross-sectional view of the main part for explanation of a manufacturing process of the printed wiring sections of the instrument panel according to the embodiment.

As illustrated in FIGS. 2A and 2B, routing grooves 10 are formed along the wiring patterns of the printed wiring sections 3 on the surface side of the panel body 2. The printed wiring sections 3 are respectively arranged on each of the routing grooves 10. Fabrication of the printed wiring sections 3 is as follows. First, as illustrated in FIGS. 3A and 3B, the routing grooves 10 are formed on the panel body 2. Next, as illustrated in FIGS. 4A and 4B, a conductive member (such as conductive ink) 30 is sprayed with an ink jet nozzle 20 over the entire region of the panel body 2. Then, as illustrated in FIG. 5, the entire surface region of the panel body 2 is wiped with e.g. sandpaper 21, thus removing the conductive member 30 on the surface of the panel body 2 (i.e., other than the conductive member within the routing grooves 10). With this, the printed wiring sections 3 as illustrated in FIGS. 2A and 2B are formed.

Figure 6A:
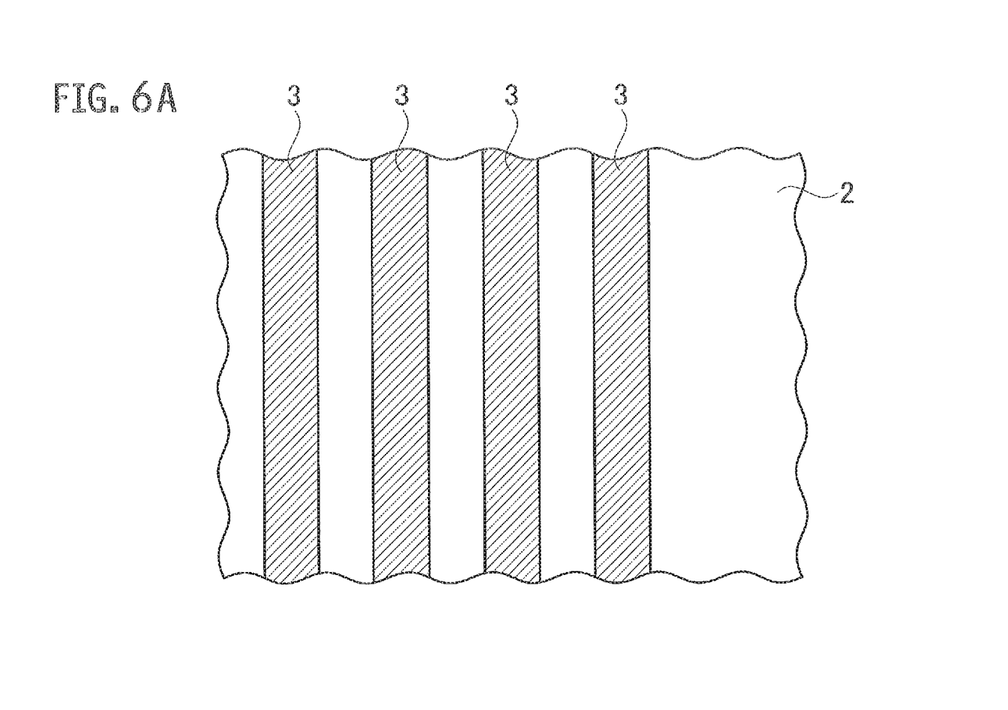
FIG. 6A is a plan view of a main part of printed wiring sections of the instrument panel according to a comparative example 1 (in which printed wiring sections 3 are illustrated as being hatched).

Moreover, in the plan views of FIGS. 2A, 4A, and 6A, the printed wiring sections 3 and the conductive member 30 are illustrated as being hatched for the sake of clarity.

According to such a structure, fabrication (processing) time for the printed wiring sections 3 can be shortened.

In a case of disposing the electronic component 7 on the way of a route of the printed wiring section 3, the routing groove 10 is not formed at that position. In other words, divided routing grooves 10 are formed. The electronic component 7 is arranged at the divided portion of the routing groove 10. Thus, the printed wiring section 3 on which the electronic component 7 is mounted is fabricated.

In other words, in a conventional example using a wire harness as the wiring member, there is usually a need to connect with the panel body side by a connector; however, in a case of the printed wiring section 3, it becomes possible to make an electronic connection without using a connector and the structure becomes simple.

COMPARATIVE EXAMPLE 1

Figure 6B:
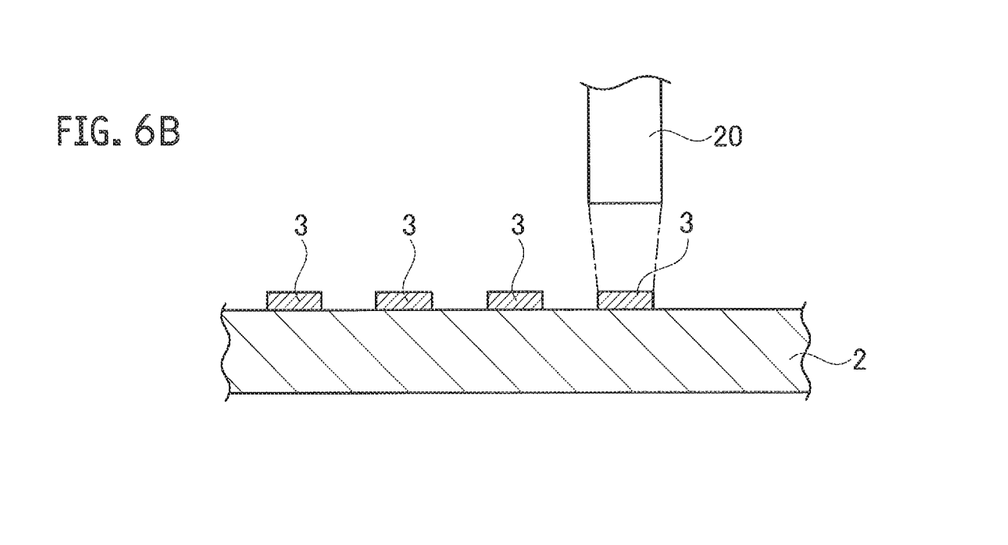
FIG. 6B is a cross-sectional view of the main part of the printed wiring sections of the instrument panel according to the comparative example 1.

In an instrument panel according to a comparative example 1 as illustrated in FIGS. 6A and 6B, a conductive member (such as conductive ink) is sprayed onto the panel body 2 along a wiring pattern with the ink jet nozzle 20. In other words, the printed wiring sections 3 are formed by drawing with the ink jet nozzle 20. Since it is necessary that all of the printed wiring sections 3 are drawn with the ink jet nozzle 20, there is a problem that the fabrication (processing) time to form the printed wiring sections 3 becomes long. In the present embodiment, such a problem is solved and it is possible to shorten the fabrication (processing) time to form the printed wiring sections 3.

(Details of the Electronic Component Arrangement and its Peripheral Printed Wiring Section)

Figure 7A:
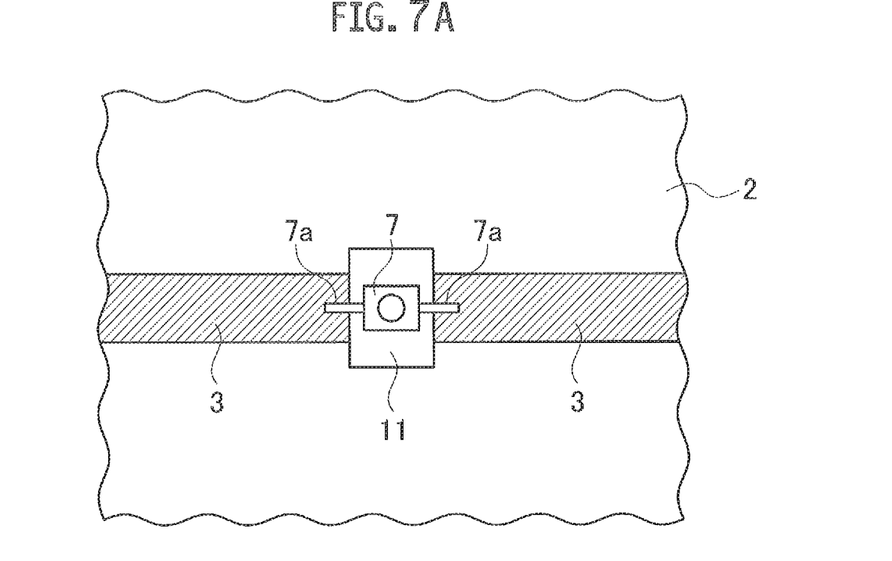
FIG. 7A is a plan view of a main part for explanation of a manufacturing process of an electronic component mounting portion of the printed wiring sections of the instrument panel according to a first modification (in which the printed wiring sections 3 are illustrated as being hatched).

FIGS. 7A to 9B illustrate a first modification of the embodiment. As illustrated in FIGS. 7A and 7B, a protrusion 11 is provided at a portion on which the electronic component 7 is arranged on the surface of the panel body 2. The printed wiring sections 3 are arranged at both sides of the protrusion 11.

Figure 7B:
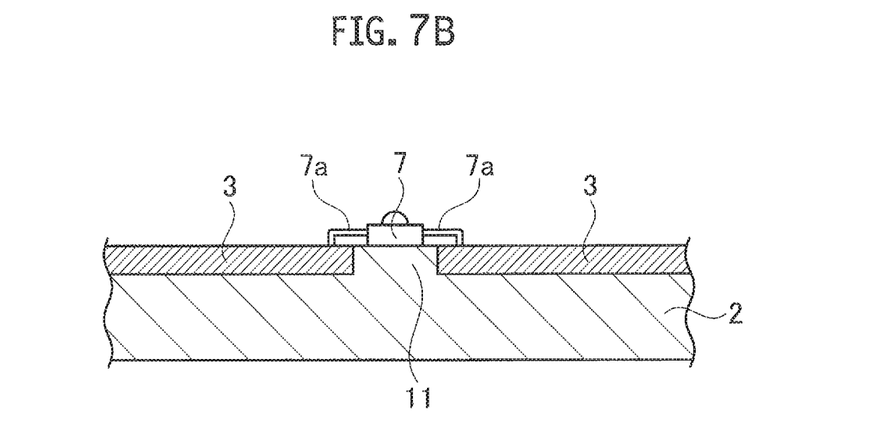
FIG. 7B is a cross-sectional view of the main part for explanation of the manufacturing process of the electronic component mounting portion of the printed wiring sections of the instrument panel according to the first modification.

The electronic component 7 is mounted on the protrusion 11. Lead portions 7a of the electronic component 7 are connected to the printed wiring sections 3 at both sides of the protrusion 11 such as by soldering.

Figure 8A:
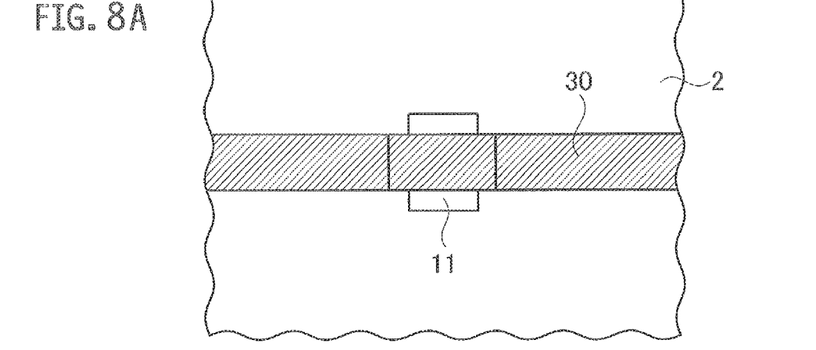
FIG. 8A is a plan view of the main part for explanation of a manufacturing process of the electronic component mounting portion of the printed wiring sections of the instrument panel according to the first modification (in which the conductive members 30 are illustrated as being hatched).
Figure 8B:
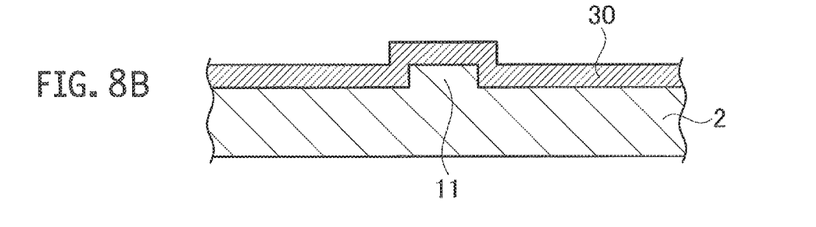
FIG. 8B is a cross-sectional view of the main part for explanation of the manufacturing process of the electronic component mounting portion of the printed wiring sections of the instrument panel according to the first modification.
Figure 9A:
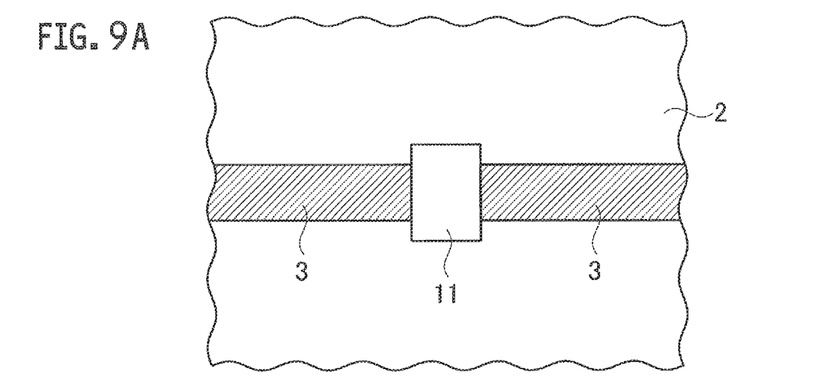
FIG. 9A is a plan view of the main part for explanation of a manufacturing process of the printed wiring sections of the instrument panel according to the first modification (in which printed wiring sections 3 are illustrated as being hatched).
Figure 9B:
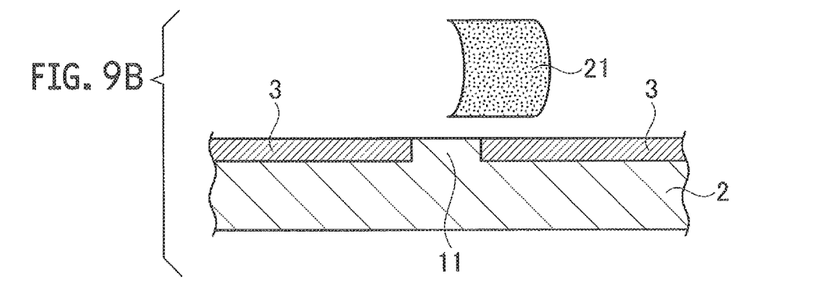
FIG. 9B is a cross-sectional view of the main part for explanation of the manufacturing process of the printed wiring sections of the instrument panel according to the first modification.

Arrangement of the electronic component 7 and fabrication of the peripheral printed wiring sections 3 are as follows. First, the protrusion 11 is formed at a mounting position of the electronic component 7 on the surface of the panel body 2. Then, as illustrated in FIGS. 8A and 8B, the conductive member 30 (such as conductive ink) is sprayed with the ink jet nozzle 20 along a wiring pattern that includes an area on the protrusion 11. Since the protrusion 11 exists on the wiring pattern, the conductive member (such as conductive ink) 30 is disposed on the upper surface of the protrusion 11 also. Then, as illustrated in FIGS. 9A and 9B, only the conductive member 30 (such as conductive ink) on the upper surface of the protrusion 11 is wiped with e.g. sandpaper 21. Thus, the divided printed wiring sections 3 are formed at both sides of the protrusion 11. Next, as illustrated in FIGS. 7A and 7B, once the electronic component 7 is mounted on the protrusion 11 and the lead portions 7a of the electronic component 7 are connected to the printed wiring sections 3 such as by soldering, it is completed.

Moreover, in the plan views of FIGS. 7A, 8A, and 9A, the printed wiring sections 3 and the conductive member 30 are illustrated as being hatched for the sake of clarity.

Since spraying of the conductive member at the ink jet nozzle 20 can be performed without considering the mounting position of the electronic component 7, controlling of the ink jet nozzle 20 is easy.

(Printed Wiring Sections for Small Current and for Large Current)

Figure 10:
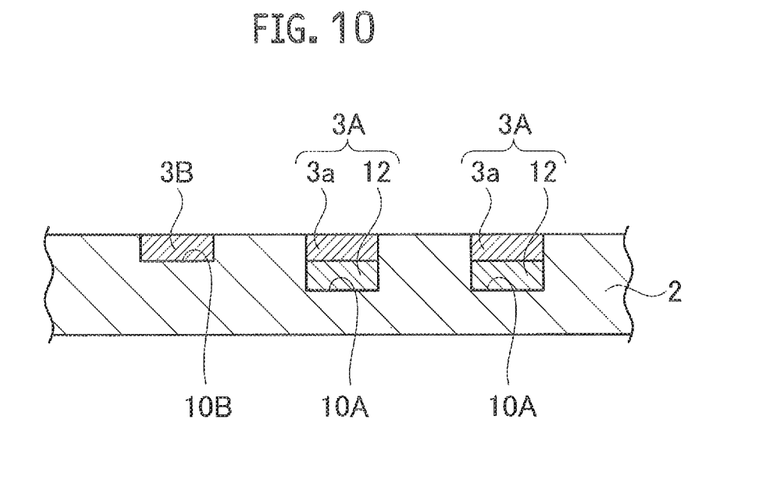
FIG. 10 is a cross-sectional view of a main part of a portion in which a printed wiring section for a small current and a printed wiring section for a large current exist in the instrument panel according to a second modification.

FIG. 10 illustrates a second modification of the embodiment. As illustrated in FIG. 10, the printed wiring sections 3A, 3B includes large current wiring sections 3A for a large current and a small current wiring section 3B for a small current. Bus bars 12 are buried along large current routing grooves 10A at the bottom of the large current routing grooves 10A in which the printed large current wiring sections 3A are arranged.

Each of the large current wiring sections 3A includes the bus bar 12 and a conductive member (such as conductive ink) 3a arranged in the large current routing groove 10A. The small current wiring section 3B is composed only of a conductive member (such as conductive ink) arranged in the routing groove for a small current 10B.

With such a structure, by preparing a panel body 2 in which the bus bars 12 are buried, operations of the later printing process for the large current wiring sections 3A and for the small current wiring section 3B can be the same. In other words, the large current wiring sections 3A and the small current wiring section 3B can be worked on by an operation of the same printing process, and thus, work efficiency can be improved.

Instead of the bus bar 12, copper foil may be buried for each of the large current wiring sections 3A also.

COMPARATIVE EXAMPLES 2 AND 3

Figure 11A:
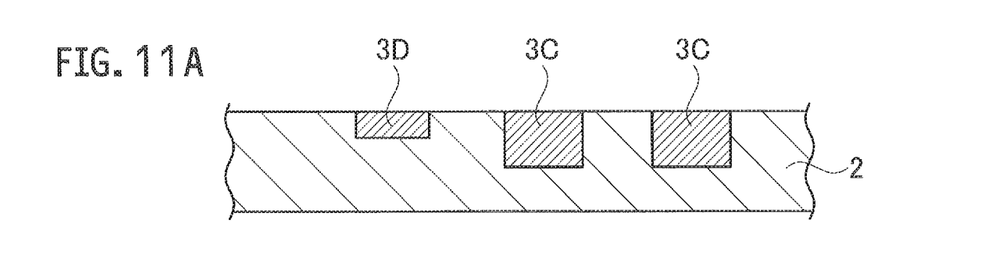
FIG. 11A is a cross-sectional view of a main part of the printed wiring sections of the instrument panel according to a comparative example 2.

In a comparative example 2 as illustrated in FIG. 11A, in a case that large current wiring sections 3C and a small current wiring section 3D are formed as the printed wiring sections 3C, 3D, thickness of each of the large current wiring sections 3C is formed to be thicker and thickness of the small current wiring section 3C is formed to be thinner.

Figure 11B:
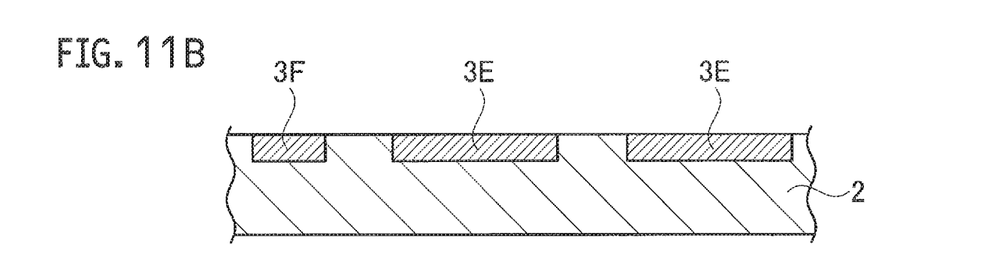
FIG. 11B is a cross-sectional view of a main part of the printed wiring sections of the instrument panel according to a comparative example 3.

In a comparative example 3 as illustrated in FIG. 11B, in a case that large current wiring sections 3E and a small current wiring section 3F are formed as the printed wiring sections 3E, 3F, width of each of the large current wiring sections 3E is formed to be wider and width of the small current wiring section 3F is formed to be narrower.

In both of the comparative examples 2 and 3, operations of the printing process for the large current wiring sections 3C, 3E and for the small current wiring sections 3D, 3F need to be altered, and the operations become complex. The above-described structure solves the problems of these comparative examples 2 and 3, and makes it possible for operations of the printing process for the large current wiring sections 3A and for the small current wiring section 3B to be made the same.

What is claimed is:

1. A vehicular panel, comprising:
a panel body on a surface side of which an electric component is installed;
a printed wiring section comprising a conductive member directly printed on the surface side of the panel body; and
an insulation outer layer arranged on the surface side of the panel body so as to cover the printed wiring section, wherein
a routing groove is formed on the panel body,
the printed wiring section is arranged in the routing groove,
the printed wiring section comprises a large current wiring section for a large current and a small current wiring section for a small current,
the routing groove includes a large current routing groove in which the large current wiring section is arranged, and a small current routing groove in which the small current wiring section is arranged,
a bus bar is buried at a bottom of the large current routing groove,
the large current wiring section comprises the bus bar and the conductive member arranged in the large current routing groove, and
the small current wiring section is composed of the conductive member arranged in the small current routing groove.

2. A wiring structure for vehicle, comprising:
a panel body on a surface side of which an electric component is installed;
an insulation outer layer arranged on the surface side of the panel body; and
a printed wiring section comprising a conductive member directly printed on the surface side of the panel body and arranged between the panel body and the insulation outer layer, wherein
a routing groove is formed on the panel body,
the printed wiring section is arranged in the routing groove,
the printed wiring section comprises a large current wiring section for a large current and a small current wiring section for a small current,
the routing groove includes a large current routing groove in which the large current wiring section is arranged, and a small current routing groove in which the small current wiring section is arranged, a bus bar is buried at a bottom of the large current routing groove, the large current wiring section comprises the bus bar and the conductive member arranged in the large current routing groove, and the small current wiring section is composed of the conductive member arranged in the small current routing groove.

\* \* \* \* \*